United States Patent
Ogura et al.

(10) Patent No.: US 7,221,005 B2
(45) Date of Patent: May 22, 2007

(54) NEGATIVE RESISTANCE FIELD-EFFECT DEVICE

(75) Inventors: Mutsuo Ogura, Ibaraki (JP); Takeyoshi Sugaya, Ibaraki (JP); Kee-Youn Jang, Ibaraki (JP); Yoshinobu Sugiyama, Ibaraki (JP)

(73) Assignees: National Institute of Advanced Industrial Science and Technology, Tokyo (JP); Japan Science and Technology Corporation, Kawaguchi-shi (JP)

( * ) Notice: Subject to any disclaimer, the term of this patent is extended or adjusted under 35 U.S.C. 154(b) by 678 days.

(21) Appl. No.: 10/561,530

(22) PCT Filed: Sep. 28, 2001

(86) PCT No.: PCT/JP01/08535

§ 371 (c)(1),
(2), (4) Date: Sep. 29, 2003

(87) PCT Pub. No.: WO02/080284

PCT Pub. Date: Oct. 10, 2002

(65) Prior Publication Data

US 2006/0267045 A1    Nov. 30, 2006

(30) Foreign Application Priority Data

Mar. 29, 2001  (JP) .............................. 2001-094464

(51) Int. Cl.
   *H01L 31/00*   (2006.01)
(52) U.S. Cl. .............................. 257/192; 257/E47.001; 257/E27.002
(58) Field of Classification Search ................ 257/192, 257/E37.001
   See application file for complete search history.

(56) References Cited

U.S. PATENT DOCUMENTS 5,486,706 A * 1/1996 Yuki et al. .................... 257/25
2005/0056827 A1* 3/2005 Li et al. ....................... 257/25

FOREIGN PATENT DOCUMENTS

| JP | 7-38078 | 2/1995 |
| JP | 7-321411 | 12/1995 |
| JP | 2001-185559 | 7/2001 |

OTHER PUBLICATIONS

Chang-Luen Wu & Wei-Chou Hsu, "Enhanced Resonant Tunneling Real-Space Transfer in δ-Doped GaAs/InGaAs Gated Dual-Channel Transistors Grown by MOCVD", IEEE Transactions on Electron Devices, vol. 43, No. 2, Feb. 1996, pp. 207-212.
Applied Physics Letters, vol. 78, No. 1, pp. 76-78 Jan. 1, 2001.
Denshi Joho Tsushin Gakkai Gijutsu Kenkyu Hokoku, CPM2000-108-116, vol. 100, No. 372, pp. 19-24 Oct. 20, 2000.
Applied Physics Letters, vol. 77, No. 3, pp. 441-443 Jul. 17, 2000.
Japanese Journal of Applied Physics, vol. 39, part 1, No. 11, pp. 6152-6156 Nov. 2000.
2001 International Conference on Indium Phosphide and Related Materials Conference Proceedings 13th IPRM, pp. 517-520, May 14, 2001-May 18, 2001.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A negative resistance field-effect element that is a negative differential resistance field-effect element capable of achieving negative resistance at a low power supply voltage (low drain voltage) and also enabling securement of a high PVCR is formed on its InP substrate 11 having an asymmetrical V-groove whose surface on one side is a (100) plane and surface on the other side is a (011) plane with an InAlAs barrier layer (12) that has a trench (TR) one of whose opposed lateral faces is a (111) A plane and the other of which is a (331) B plane. An InGaAs quantum wire (13) that has a relatively narrow energy band gap is formed at the trench bottom surface as a high-mobility channel. An InAlAs modulation-doped layer (20) having a relatively wide energy band gap is formed on the quantum wire as a low-mobility channel. A source electrode (42) and a drain electrode (43) each in electrical continuity with the quantum wire (13) constituting the high-mobility channel through a contact layer (30) and extending in the longitudinal direction of the quantum wire (13) as spaced from each other, and a gate electrode (41) provided between the source electrode (42) and the drain electrode (43) to face the low-mobility channel (20) through an insulating layer or a Schottky junction, are provided. Owing to the foregoing configuration, a very narrow-width quantum wire whose lateral confinement size can, without restriction by the lithographic technology limit, be made 100 nm or less is usable as a high-mobility channel, whereby there can be obtained a negative resistance field-effect element that develops a negative characteristic at a low power supply voltage and enables securement of a high PVCR.

3 Claims, 3 Drawing Sheets

F I G. 1(a)
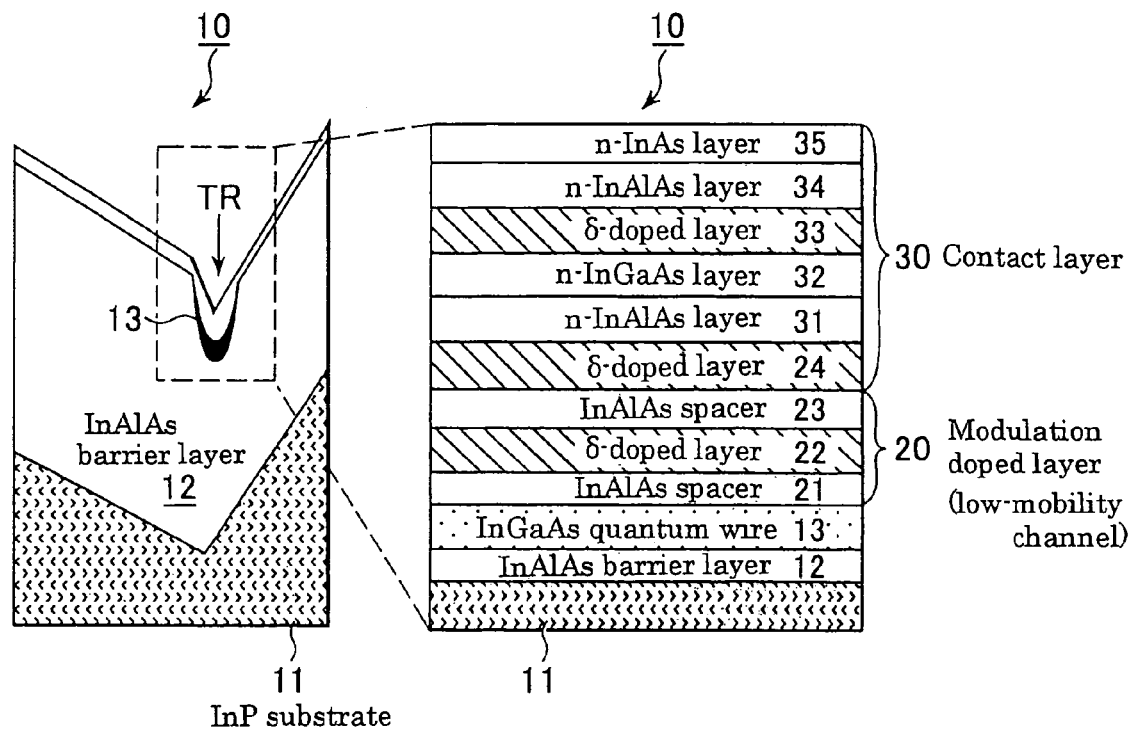
F I G. 1(b)
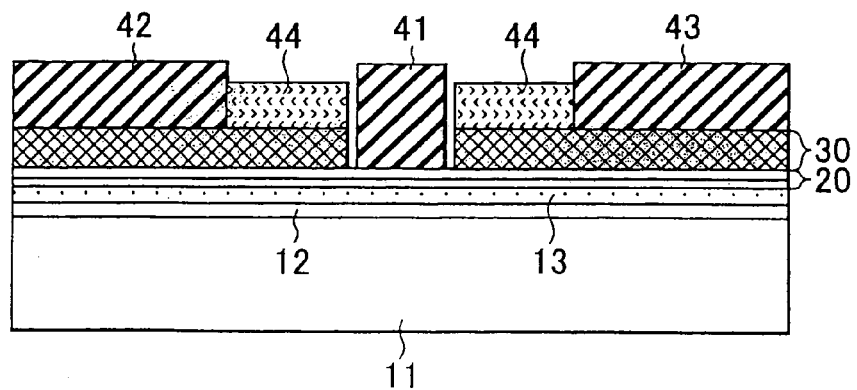

NEGATIVE RESISTANCE FIELD-EFFECT DEVICE

TECHNICAL FIELD

The present invention relates to a field-effect element that exhibits negative differential resistance (NDR) and more particularly relates to an improvement for enhancing a peak-to-valley current ratio (hereinafter abbreviated as PVCR), which, being the ratio between drain current value immediately before negative differential resistance is exhibited and drain current value immediately after occurrence of negative differential resistance, is an index for measuring negative differential resistance effect, and, further, for enabling the field-effect element to exhibit a negative characteristic at a low power supply voltage. In this description, a field-effect element that exhibits negative differential resistance will, in accordance with general practice, be called simply a negative resistance field-effect element.

BACKGROUND ART

Elements having negative differential resistance are required in semiconductor integrated circuits. As with other active elements, such a negative resistance element of course becomes more attractive with the element's ability to operate at lower voltage and operate at higher speed (with better high-frequency characteristics) and, as such, has been a subject of various studies in the past.

Although a so-called two-terminal element having no control terminal exists, the lack of a control terminal itself tends to be a drawback, limiting control from the outside and usually making the element unsuitable for application as a logic element and as an integrated element. Naturally, no amplification capability or the like can be anticipated. Therefore, a need is, after all, felt for a negative resistance element having a three-terminal structure including at least a control terminal. This assumes, however, what will no doubt continue to be most emphasized as a future trend will be realization of low-voltage operation and a high PVCR.

One response to this has been the proposal of a configuration using a compound heterojunction structure utilizing a high-mobility layer portion whose energy band gap is relatively narrow as the main transit channel for electrons and providing as a second channel in contact with this a low-mobility layer portion with a relatively wide energy band gap (e.g., Reference 1: "Enhanced Resonant Tunneling Real-Space Transfer in delta-Doped GaAs/InGaAs Gated Dual-Channel Transistors Grown by MOCVD", Chang-Luen Wu et al., IEEE Transactions on Electron Devices, vol. 43, No. 2 (1996) 207).

In such a low-dimensional field-effect element having a dual-channel structure, transit electrons (hot carriers) accelerated by the drain voltage and raised to the energy level of the potential barrier between the two channels are real-space-transferred to the low-mobility channel sandwiched between the gate and the main high-mobility channel by applying gate voltage positively. The electrons transferred to the low-mobility channel travel at a reduced speed or stop. As a result, the planar density of the electrons passing through the high-mobility channel becomes equal to the result of subtracting the charge accumulated in the low-mobility channel from the total amount of charge induced by the gate voltage for satisfying charge neutrality condition, thereby producing the same effect as biasing the gate bias by the same amount in the negative direction. Therefore, owing to the resulting decrease of electrons in the high-mobility channel, the drain current declines substantially to give rise to negative differential resistance.

On the other hand, the present inventors previously proposed that for implementing this principle a dual-channel field-effect element structure using a quantum wire for the high-mobility channel is advantageous for suppressing dispersion of carriers in the channel (JP-A 2001-185559). Negative resistance is easier to induce in this element than in one using a quantum well, making it promising for use as an ultrahigh-speed logic element and the like.

However, it was difficult to actually make the lateral confinement size of the quantum wire smaller than around 100 nm and, therefore, while the power supply voltage at which negative differential resistance appeared (generally the drain voltage of a field-effect element) could be lowered compared with the prior art, it could still not be reduced adequately. Or to put it more exactly, there still was room for improvement.

An object of the present invention is to provide a negative resistance field-effect element that can achieve negative resistance at a lower drain voltage than conventionally while also ensuring a PVCR of adequate value.

The negative resistance field-effect element according to the present invention comprises: an InAlAs or AlGaAs barrier layer that, owing to being formed on an InP or GaAs substrate having an asymmetrical V-groove whose surface on one side is a (100) plane and surface on the other side is a (011) plane, has a trench, one of whose opposed lateral faces is a (111) A plane and the other of which is a (331) B plane; an InGaAs or GaAs quantum wire grown on a trench bottom surface of this barrier layer as a high-mobility channel having a relatively narrow energy band gap; an InAlAs or AlGaAs spacer layer grown on this quantum wire as a low-mobility channel having a relatively wide energy band gap; a source electrode and a drain electrode each in electrical continuity with the high-mobility channel through a contact layer and extending in a longitudinal direction of the quantum wire as spaced from each other; and a gate electrode provided between the source electrode and the drain electrode to face the low-mobility channel through an insulating layer or a Schottky junction.

Further, the present invention encompasses an element in which a delta-doped layer that lowers conduction band energy is provided locally within the low-mobility channel and the InAlAs or AlGaAs spacer layer constitutes a modulation-doped layer, and an element in which the contact layer contacted by the source electrode and drain electrode is a laminated structure of an n-type InAlAs layer, an n-type InGaAs layer, an n-type InGaAs layer and an n-type InAs layer.

Owing to the foregoing structure, lateral confinement size can, without restriction by the lithographic technology limit, be made 100 nm or less if required to thereby enable use of a very narrow-width quantum wire as the high-mobility channel and thereby achieve the object.

BRIEF DESCRIPTION OF DRAWINGS

FIG. 1(A) is a cross-sectional structural diagram of an embodiment of the negative resistance field-effect element according to the present invention.

FIG. 1(B) is a cross-sectional structural diagram in a direction perpendicular to the negative resistance field-effect element of FIG. 1(A).

BEST MODE FOR CARRYING OUT THE INVENTION

Figure 2:
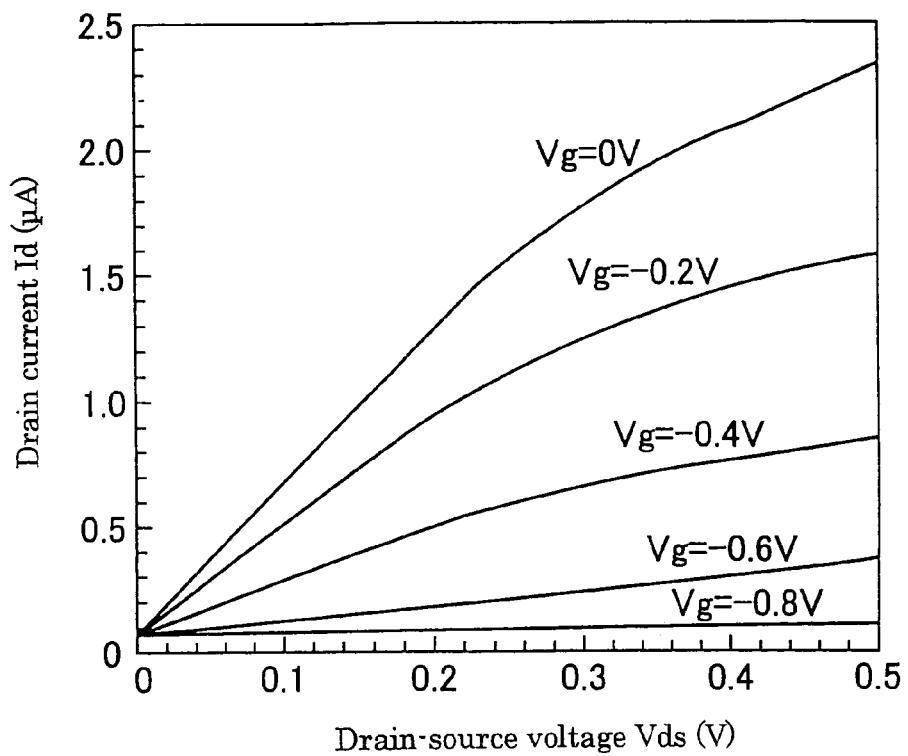
FIG. 2 is a static characteristic plot of drain-source voltage versus drain current obtained at room temperature in an example of the negative resistance field-effect element according to the present invention.

A preferred embodiment of a negative resistance field-effect element 10 configured according to the present invention is shown in FIGS. 1(A) and (B). As viewed statically from the sectional structure shown in the left-side diagram of FIG. 1(A), an InAlAs or AlGaAs barrier layer, in this case an InAlAs barrier layer 12, is formed on an InP or GaAs substrate, in the illustrated case an InP substrate 11, having an asymmetrical V-groove, thereby forming a trench TR that is a deep V-groove having very steep lateral faces at the location of the InAlAs barrier layer 12 where the V-groove is present in the underlying InP substrate 11. The distance between the inclined surfaces near the bottom portion of the trench TR (space width) can, as explained later, be formed very narrowly.

Details of the sectional lamination at the essential portion enclosed by the phantom line in the left-side diagram are shown in the right-side diagram of FIG. 1(A). Referring to this, first an InGaAs or GaAs quantum wire, in this case an InGaAs quantum wire 13, having a relatively narrow energy band gap is formed on the bottom surface of the trench TR of the InAlAs barrier layer 12 as a high-mobility channel, and an InAlAs or AlGaAs spacer layer, in this case an InAlAs spacer layer 20, having a relatively wide energy band gap is formed on this as a low-mobility channel 20.

In this embodiment, however, the low-mobility channel 20 can actually also be viewed as a two-layer structure of a lower layer 21 and an upper layer 22. This is because, in order to utilize the forming of a depression in the conduction band of the low-mobility channel 20 so as to make it easy to capture carriers passing from the high-mobility channel through the tunnel barrier to arrive by real-space transfer, a delta-doped layer (δ-doped layer) 22 constituted of an n-type silicon single-atom layer is included midway of the depth thereof. From the doping aspect, such a low-mobility channel 20 is also called a modulation-doped layer.

As explained later, on the low-mobility channel 20 is formed a contact layer 30 for each of a source electrode 42 and a drain electrode 43. The contact layer 30 in this embodiment is a non-alloy contact layer also constituted as a laminated structure of multiple layers, having an n-InAlAs layer 31, an n-InGaAs layer 32, a delta-doped layer 33, an n-InAlAs layer 34 and an n-InAs layer 35 stacked in this order starting from the bottom layer. While this is based on the conditions for achieving good mutual lattice matching, good conductivity and good ohmic contact of the source electrode 42 and drain electrode 43, other considerations are of course also conceivable and the number of stacked layers and the material thereof are not restricted insofar as the foregoing object is achieved.

In FIG. 1(B) is shown the related cross-sectional structure lying perpendicular to FIG. 1(A). The source electrode 42 and drain electrode 43 are provided on the contact layer 30 in accordance with a known existing lithography technique to be in electrical continuity with the quantum wire 13 constituting the high-mobility channel and to extend in the longitudinal direction of the quantum wire 13 as disposed in a mutually spaced relationship. Further, between the source electrode and the drain electrode is formed, preferably by the self-alignment method, a gate electrode 41 that faces the low-mobility channel 20 through an insulating layer or a Schottky junction (in this case through a Schottky junction with respect to the modulation-doped layer 20). Generally, appropriate oxide layers, e.g., silicon dioxide layers 44, are formed on the regions between the opposite sides of the gate electrode 41 and the source and drain electrodes.

It should be noted that while in the case of the illustrated embodiment the contact layer 30 is structured first to contact the low-mobility channel 20 and further to be in continuity with the quantum wire 13 constituting the high-mobility channel through the low-mobility channel 20, the contact layer 30 can be fabricated to directly contact the high-mobility channel 13. Although the electrode material is arbitrary, Ti/Pt/Au and the like can be cited by way of example.

In such element 10 of the present invention, upon application of a gate voltage of appropriate magnitude, the carriers in the high-mobility channel 13 that have been accelerated by the drain voltage to become hot carriers pass through the energy barrier between the high-mobility channel 13 and the low-mobility channel 20 to move into the low-mobility channel 20, where they travel or stop. Because of this, as was pointed out earlier, a situation arises that is substantially equivalent to that of increasing the gate voltage in the negative direction, giving rise to negative differential resistance that reduces the drain current.

To rephrase, owing to the charge neutrality condition, since the total amount of electrons accumulated at a given gate voltage is fixed, the electrons of the high-mobility channel 13 decrease by the amount of electrons transferred to the low-mobility channel 20 to lower the conductance there and give rise to negative differential resistance. Here, when, as in this embodiment, the delta-doped layer 22 is provided in the low-mobility channel 20, a depression whose deepest portion is at the delta-doped layer occurs in the conduction band to ensure stable capturing/stopping of the tunnel-transferred carriers. However, as a matter of operating principle, this delta-doped layer is not needed and it suffices for the aforesaid dual-channel structure to be satisfied.

Still, as mentioned earlier, one important key from the aspect of the element's characteristics rests in how to obtain a narrow-width, fine-cross-section quantum wire 13 with a large quantum-confinement effect. And in this regard, there can, at least in accordance with the limiting conditions among the substantial constituents of the present invention, be obtained a quantum wire 13 that is at least narrower than that of the prior art without restriction by the lithographic technology limit. However, regarding this, some of the inventors have in addition already obtained very fine quantum wires in actual practice.

Figure 4A:
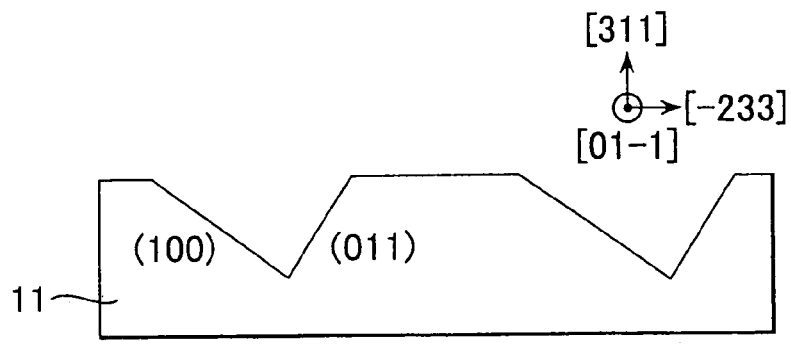
FIGS. 4(A), 4(B) and 4(C) are explanatory diagrams of an example of a trench shape for forming quantum wires that is advantageous for use in fabricating a negative resistance field-effect element according to the present invention.

In the following, therefore, explanation will be given with respect to a still more concrete example of fabricating a negative resistance field-effect element 10 of the present invention that includes a method in accordance therewith. First, as shown in FIG. 4(A), a 2-μm line-and-space pattern is formed in the [01−1] direction on an InP (311) A substrate using an ordinary photolithography process and an asymmetrical V-groove is then produced by chemical etching (wet etching) using an $HCl:H_3PO_4:H_2O_2$ (=50:10:1) solution. The inclined surfaces of the asymmetrical V-groove are formed in the (100) plane and the (011) plane. The angle between the inclined surfaces is 90 degrees. After the surface oxide film of this substrate is removed with hydrofluoric acid, the substrate is introduced into an MBE (molecular beam epitaxy) chamber and substrate surface cleaning is conducted by increasing the substrate temperature to 400° C. and holding it thereat for 2 minutes under exposure to atomic hydrogen.

Figure 4B:
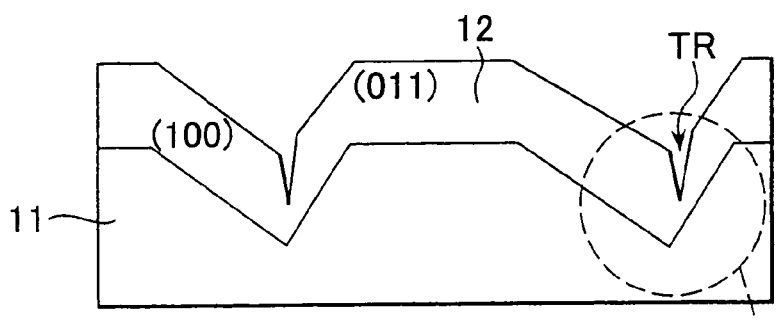
Figure 4C:
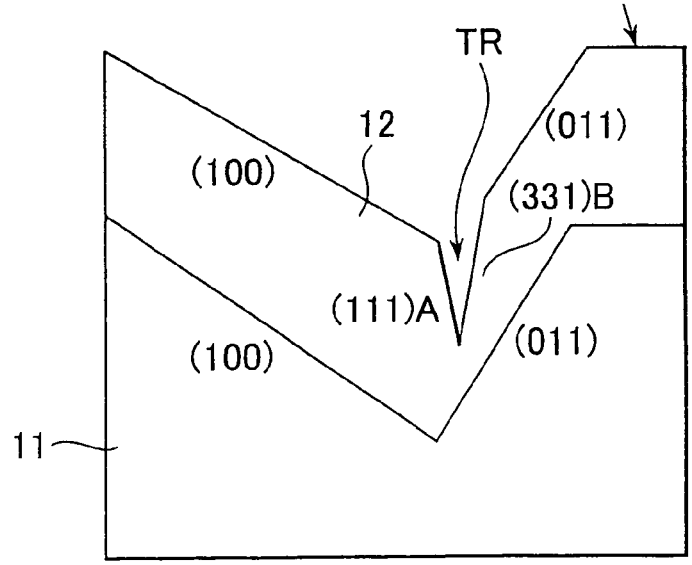

When the InAlAs (or AlGaAs) barrier layer 12 is grown on the InP (311) A-V-groove substrate 11 by MBE while restraining dispersion of adsorbed atoms by a V-group source using cracking $As_2$, then, as shown in FIG. 4(B) and the enlarged essential portion thereof in FIG. 4(C), a (111) A plane is formed on the inclined lateral face of the (100) plane and a (331) B plane is formed on the lateral face of the (110) plane to form the trench TR, namely, a sharp V-groove with an intersection angle of 22 degrees. A deep trench TR of such steeply inclined surface configuration cannot be formed by another method of the prior art.

As was explained earlier, when an InGaAs or GaAs quantum wire is grown on the bottom of such a trench TR, a quantum wire 13 of very narrow width exceeding the lithography limit can be formed. As also explained earlier, for this it suffices to successively form the low-mobility channel 20 and the contact layer 30 by an appropriate conventional method.

By way of further information, the thickness of each of the different layer films in the inventors' prototype is: InAlAs barrier layer 12, 400 nm; InGaAs quantum wire 13, 10 nm; InAlAs spacer layer 21, 10 nm; InAlAS spacer layer 23, i.e., upper layer on other side of the delta-doped layer 22, 15 nm, n-InAlAs layer 31 and n-InGaAs layer 32 in non-alloy ohmic contact layer 30, 1 nm and 5 nm; upper n-InAlAs layer 34 on other side of delta-doped layer, 1 nm; and n-InAs layer, i.e., uppermost layer, 1 nm. The In, Ga and Al fluxes are $In_{0.53}Ga_{0.47}As$ and $In_{0.52}Al_{0.48}As$, values at which the InGaAs and InAlAs compositions lattice-match on the InP substrate. Regarding the As partial pressure during growth, $As_4$ is set at $1.3 \times 10^{-3}$ Pa and $As_2$ at $8.3 \times 10^{-4}$ Pa. $As_4$ is used for growth starting from the InGaAs quantum wire 13.

Figure 3:
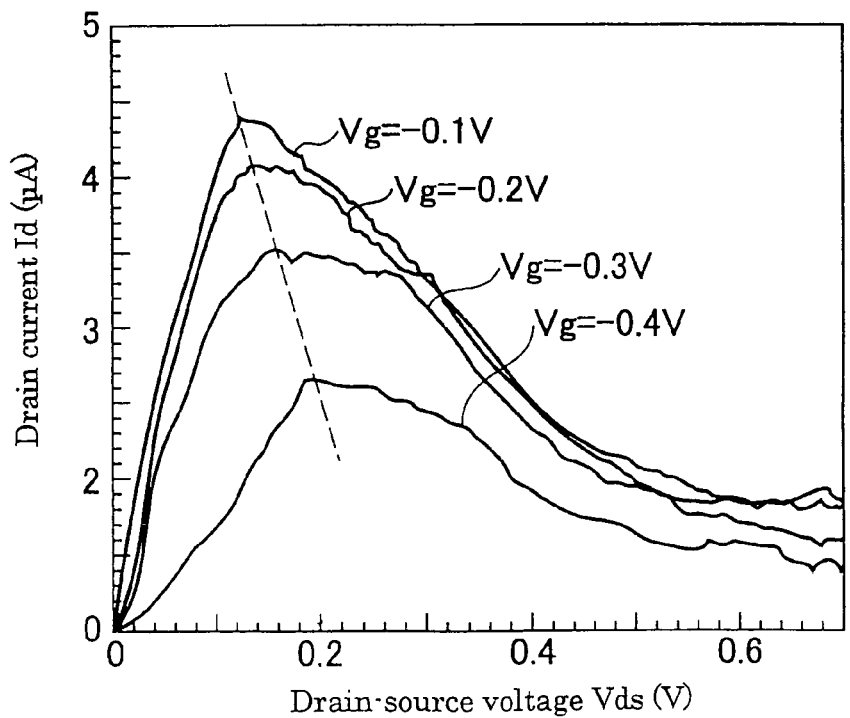
FIG. 3 is a static characteristic plot of drain-source voltage versus drain current obtained at 40 K in an example of the negative resistance field-effect element according to the present invention.

The static characteristics at room temperature of the negative resistance field-effect element 10 according to the present invention are shown first in FIG. 2. The horizontal axis represents the drain-source voltage Vds and the vertical axis the drain current Id. The section of the quantum wire 13 is fabricated to about 10 nm× about 20 nm and the gate length to 2 µm. At room temperature, the characteristics are those of an ordinary field-effect transistor (FET) having good saturation characteristics. In contrast, as shown in FIG. 3, when the operating temperature is reduced to 40 K, pronounced negative differential resistance is observed. This is negative resistance produced by gate field-assisted real space transfer and is produced by electrons of the InGaAs quantum wire 13 serving as the high-mobility channel passing through the tunnel barrier and tunneling into the low-mobility channel 20. The drain voltage at which negative resistance arises (Onset Voltage: $V_{NDR}$) is 0.12 V when Vg=−0.1 V, which is very low in comparison with negative resistance devices reported heretofore. As regards PVCR as well, an adequate value of 4.3 when Vg=−0.1 V is secured.

Although the drain voltage at which negative resistance develops falls together with the gate voltage from 0.2 V, this is because the effective barrier layer height as viewed from the channel decreased owing to the gate voltage. In the case of a conventional real-time transfer element, the voltage at which negative resistance appears is 1 V or greater, so that the enhancement of element characteristics by the present invention is marked.

It is noted that although the drain voltage at which negative differential resistance arises tends to decrease with increasing device temperature, this is thought to be because increase in carrier temperature causes a relative lowering of the height of the barrier layer through which the carriers are to be transferred.

INDUSTRIAL APPLICABILITY

An explanation was made in the foregoing with reference to a preferred embodiment of the present invention. Since the negative resistance field-effect element of the present invention can achieve negative resistance at a low drain voltage and achieve an adequate PVCR, it has merits and features unavailable heretofore and, as such, can be expected to find applications in low-power consumption high-frequency generators, memories and the like.

The invention claimed is:

1. A negative resistance field-effect element comprising: an InAlAs or AlGaAs barrier layer (12) that, owing to being formed on an InP or GaAs substrate (11) having an asymmetrical V-groove whose surface on one side is a (100) plane and surface on the other side is a (011) plane, has a trench (TR), one of whose opposed lateral faces is a (111) A plane and the other of which is a (331) B plane; an InGaAs or GaAs quantum wire (13) grown on a trench bottom surface of the barrier layer as a high-mobility channel having a relatively narrow energy band gap; an InAlAs or AlGaAs spacer layer (21) grown on the quantum wire as a low-mobility channel having a relatively wide energy band gap; a source electrode (42) and a drain electrode (43) each in electrical continuity with the high-mobility channel (13) through a contact layer (30) and extending in a longitudinal direction of the quantum wire as spaced from each other; and a gate electrode (41) provided between the source electrode and the drain electrode to face the low-mobility channel through an insulating layer or a Schottky junction.

2. The negative resistance field-effect element according to claim 1, further comprising a delta-doped layer (22) that lowers conduction band energy and is provided locally within the low-mobility channel (20) and wherein the InAlAs or AlGaAs spacer layer constitutes a modulation-doped layer.

3. The negative resistance field-effect element according to claim 1, wherein the contact layer is a laminated structure of an n-type InAlAs layer, an n-type InGaAs layer, an n-type InAlAs layer and an n-type InAs layer.

* * * * *